United States Patent [19]

Venkatesan et al.

[11] Patent Number: 5,459,096
[45] Date of Patent: Oct. 17, 1995

[54] PROCESS FOR FABRICATING A SEMICONDUCTOR DEVICE USING DUAL PLANARIZATION LAYERS

[75] Inventors: Suresh Venkatesan; Stephen Poon, both of Austin, Tex.

[73] Assignee: Motorola Inc., Schaumburg, Ill.

[21] Appl. No.: 270,545

[22] Filed: Jul. 5, 1994

[51] Int. Cl.$^6$ .................................................. H01L 21/302
[52] U.S. Cl. ..................... 437/67; 437/61; 437/42; 437/59; 437/228; 148/DIG. 5; 257/370; 257/506
[58] Field of Search .............................. 437/67, 228, 69, 437/72, 61, 62, 59, 42; 148/DIG. 50; 257/370, 506

[56] References Cited

U.S. PATENT DOCUMENTS

| | | | |
|---|---|---|---|
| 4,222,792 | 9/1980 | Lever et al. | 437/67 |
| 4,571,819 | 2/1986 | Rogers et al. | 437/62 |
| 4,671,851 | 6/1987 | Beyer et al. | 437/67 |
| 4,839,306 | 6/1989 | Wakamatsu | 437/67 |
| 4,842,675 | 6/1989 | Chapman et al. | 437/228 |
| 4,876,223 | 10/1989 | Yoda et al. | 437/228 |
| 4,892,614 | 1/1990 | Chapman et al. | 437/67 |
| 5,015,602 | 5/1991 | Van Der Plas et al. | 437/67 |
| 5,244,827 | 9/1993 | Dixit et al. | 437/67 |
| 5,256,592 | 10/1993 | Matsushita | 437/67 |
| 5,294,562 | 3/1994 | Lur et al. | 437/67 |
| 5,362,669 | 11/1994 | Boyd et al. | 437/67 |
| 5,387,540 | 2/1995 | Poon et al. | 437/67 |

FOREIGN PATENT DOCUMENTS

| | | | |
|---|---|---|---|
| 0029438 | 2/1984 | Japan | 437/67 |
| 0050540 | 3/1984 | Japan | 437/67 |
| 0227136 | 12/1984 | Japan | 437/67 |
| 0026240 | 2/1986 | Japan | 437/67 |
| 0174645 | 8/1986 | Japan | 437/67 |
| 0046543 | 2/1987 | Japan | 437/67 |
| 0025433 | 1/1989 | Japan | 437/67 |

OTHER PUBLICATIONS

T. Furukawa et al., Extended Abstracts, vol. 90-2, Oct. 14–19, 1990, "Gate Oxide Integrity Shallow–Trench–Isolation Technology", pp. 415–416.

Andres Bryant, IEEE Electron Device Letters, vol. 14, No. 8, Aug. 1993, "The Current–Carrying Corner Inherent to Trench Isolation", pp. 412–414.

Yoshihiro Hayashi et al., The Institute of Electronics, Information and Communication Engineers of Japan, Solid Sate Development Devices and Materials, Aug. 26–28, 1992, "Nitride Masked Polishing (NMP) Technique for Surface Planarization of Interlayer–Dielectric Films", pp. 533–535.

*Primary Examiner*—Olik Chaudhuri
*Assistant Examiner*—Long Pham
*Attorney, Agent, or Firm*—Jasper W. Dockrey

[57] ABSTRACT

An improved planarization process includes the steps of forming recessed regions (38) and elevated regions (34) in a semiconductor substrate (30). The substrate is oxidized to form an oxide liner (39) overlying the recessed regions, and a fill material (40) is deposited to overlie the substrate (30) filling the recessed regions (38). An etching process is used to remove portions of the fill material (40) and to expose portions of a first planarization layer (44) overlying the elevated regions (34) of the substrate (30). The fill material is etched and a second planarization layer (46) is deposited to overlie dielectric portions (42), and portions (44) of first planarization layer (32) exposed by the etching process. A chemical-mechanical-polishing process is then carried out to form a planar surface (47), and remaining portions of the planarization layers and fill material are removed.

10 Claims, 3 Drawing Sheets

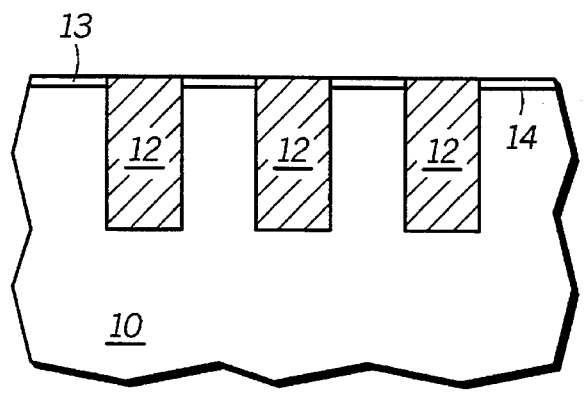
FIG.1-a
-PRIOR ART-
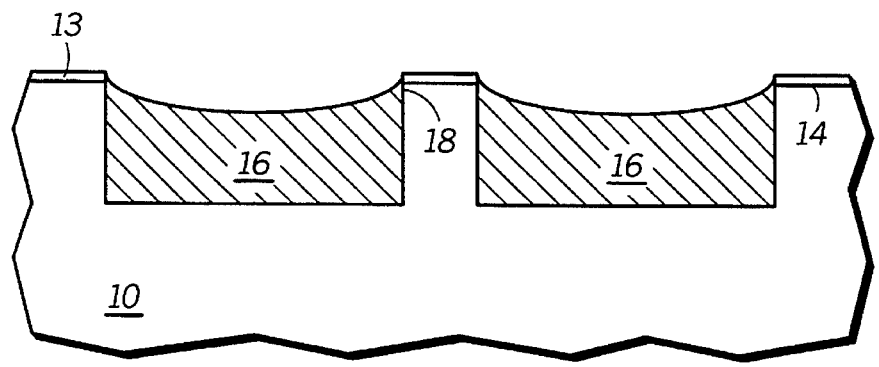
FIG.1-b
-PRIOR ART-
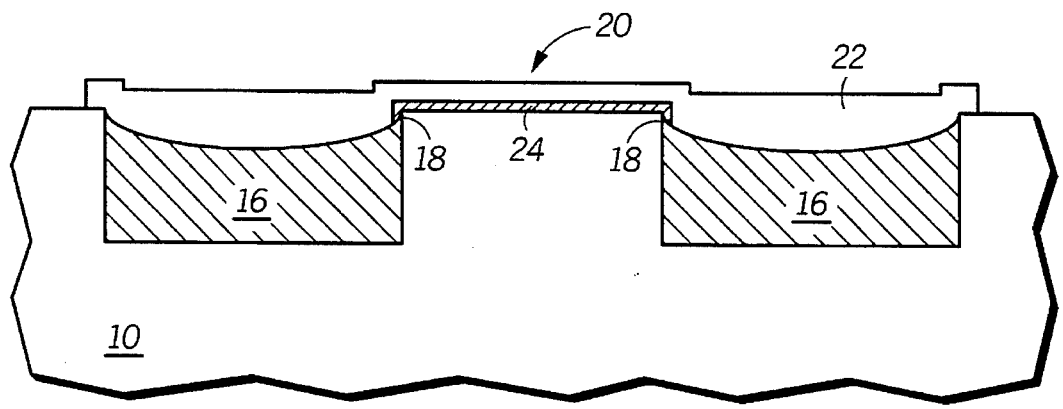
FIG.1-c
-PRIOR ART-

PROCESS FOR FABRICATING A SEMICONDUCTOR DEVICE USING DUAL PLANARIZATION LAYERS

RELATED APPLICATIONS

Related material is disclosed in commonly assigned patent application filed Sep. 30, 1993, and having Ser. No. 08/130,052 now U.S. Pat. No. 5,387,540.

FIELD OF THE INVENTION

This invention relates in general to a method for fabricating a semiconductor device, and more particularly to a method for forming a planarized surface in a semiconductor device.

BACKGROUND OF THE INVENTION

The increasing need to form planar surfaces in semiconductor device fabrication has led to the development of process technology known as chemical-mechanical-polishing (CMP). In the CMP process, semiconductor substrates are rotated, face down, against a polishing pad in the presence of an abrasive slurry. Most commonly, the layer to be planarized is an electrically insulating layer overlying active circuit devices. As the substrate is rotated against the polishing pad, the abrasive force grinds away the surface of the insulating layer. Additionally, chemical compounds within the slurry undergo a chemical reaction with the components of the insulating layer to enhance the rate of removal. By carefully selecting the chemical components of the slurry, the polishing process can be made more selective to one type of material than to another. For example, in the presence of potassium hydroxide, silicon dioxide is removed at a faster rate than silicon nitride. The ability to control the selectivity of a CMP process has led to its increased use in the fabrication of complex integrated circuits.

A common requirement of all CMP processes is that the substrate be uniformly polished. In the case of polishing an electrically insulating layer, it is desirable to polish the layer uniformly from edge to edge on the substrate. To ensure that a planar surface is obtained, the electrically insulating layer must be uniformly removed. Uniform polishing can be difficult because several machine parameters can interact to create non-uniformity in the polishing process. For example, in the case of CMP, misalignment of the polishing wheel with respect to the platen can create regions of non-uniform polishing across the diameter of the platen. Other machine parameters, such as non-homogeneous slurry compositions, and variations in the platen pressure, and the like, can also create non-uniform polishing conditions.

Recently, CMP has been applied to the fabrication of trench isolation regions in metal-oxide-semiconductor (MOS) devices and bipolar-complementary-MOS (BiC-MOS) devices. The isolation process typically includes the formation of trenches in a silicon substrate, followed by the deposition of silicon dioxide over the surface of the substrate and into the trenches. The silicon dioxide is then polished back by CMP. A polish stop layer is provided on the substrate surface to prevent the unwanted removal of underlying portions of the substrate. The silicon dioxide is ground away by the polish wheel until the polish stop layer is reached. Ideally, upon exposure of the polish stop layer, the polish removal ceases resulting in a uniformly smooth surface across the entire substrate. Important measures of the CMP process are the edge-to-edge polishing uniformity, known as global uniformity, and local uniformity. The local polishing uniformity is influenced by the material characteristics of individual regions of the substrate surface.

In a trench isolation process, local nonuniformity in a CMP process can depend upon the pattern density of isolation regions in the semiconductor substrate. Variations in pattern density can lead to variations in the polishing characteristics of the substrate within individual die in the substrate. Typically, the amount of material removed in a given amount of time depends upon the pattern density of isolation regions. For example, localized areas of nonuniform polishing can occur in substrate areas having varying degrees of pattern density. Areas having closely spaced active devices are prone to slower, but uniform, polishing due to the presence of adequate polish stop material underlying the layer being planarized. Correspondingly, in areas having a low pattern density, a smaller area of exposed polish stop material is present, and more material is removed from the substrate. Moreover, large areas of exposed planarizing material are susceptible to dishing. Localized nonuniform polishing characteristics are illustrated in FIGS. 1-a and 1-b.

FIG. 1-a illustrates, in cross-section, a portion of a semiconductor substrate 10 formed in accordance with a CMP process of the prior art. The substrate includes a plurality of high-density isolation regions 12. Isolation regions, such as those illustrated, are typically employed to isolate portions of an integrated circuit device. The isolation regions are formed in a semiconductor substrate and placed in close proximity to each other. FIG. 1-a shows a portion of substrate 10 following the planarization of the substrate. A polish stop layer 13 overlies a surface 14 of substrate 10.

FIG. 1-b illustrates, in cross-section, a portion of semiconductor substrate 10 having low-density active regions surrounded by wide isolation regions 16 formed therein. The portion of substrate 10 illustrated in FIG. 1-b is planarized by the same process used to form substrate surface 14, and surface 14 is continuous with that shown in FIG. 1-a. By comparing FIGS. 1-a and 1-b, it is seen that, following the planarization process, high-density isolation regions 12 protrude above substrate surface 14, while wide isolation regions 16 have been "dished" by the polishing process, and are recessed below substrate surface 14.

As shown in FIG. 1-a, the CMP process forms substrate surface 14 below the uppermost surface of isolation regions 12. The condition illustrated in FIG. 1-a is created by the larger quantity of polish stop material in the densely packed region of the substrate. Subsequent processing steps, which remove the polish stop layer 13 formed on the surface of substrate 10 prior to the CMP process, tend to equalize the substrate surface 14 and the uppermost surface of isolation regions 12.

In regions of the substrate containing large isolation regions, and correspondingly less polish stop material, the situation illustrated in FIG. 1-a is reversed. The initial planarization process results in removal of substantial quantities of dielectric material. In substrate regions such as that shown in FIG. 1-b, the polish stop layer 13 is reduced to a very thin layer by the polishing process. The polishing process has dished out the isolation regions 16 reducing their total thickness. The nonuniform polishing thus reduces the total thickness of isolation regions 16 as compared to isolation regions 12. The problem is exacerbated by subsequent processing steps following planarization, where the surface of 16 can be recessed below the surface 14, leading to the formation of corner regions 18.

Although the non-uniform planarization process is itself a serious detriment to high quality integrated circuit fabrication, the situation illustrated in FIG. 1-b creates a special problem, which impacts the performance of transistor devices in an integrated circuit. The non-uniform planarization results in the formation of corner regions 18, illustrated in FIG. 1-b. Corner regions 18 are detrimental to the operation of MOS transistors formed in portions of the substrate intermediate to isolation regions 16.

FIG. 1-c illustrates, in cross-section, an MOS transistor 20 fabricated in a region of substrate 10 between isolation regions 16. MOS transistor 20 includes a gate electrode 22 separated from substrate 10 by a gate dielectric layer 24. Portions of gate electrode 22 and gate dielectric layer 24 necessarily overlie corner regions 18. The presence of corner regions 18 in MOS transistor 20 can cause sub-threshold leakage currents in the channel region of the transistor during periods when the transistor is switched off.

The non-uniform planarization associated with varying densities of isolation regions affects a wide variety of integrated circuit devices. Virtually all MOS and BiCMOS integrated circuits include regions of varying isolation geometry and packing densities. Accordingly, improved planarization techniques are necessary to overcome both global and localized non-uniform planarization induced by variations in the pattern-density of isolation regions.

SUMMARY OF THE INVENTION

In practicing the present invention there is provided an improved planarization process, which includes the formation of an oxide liner in recessed regions of a semiconductor substrate coupled with the deposition of an additional planarization layer. The improved planarization process results in the formation of substrate features, such as trench structures, and the like, having rounded corners at the substrate surface, and isolation regions substantially coplanar with the substrate surface. In one embodiment of the invention, a substrate is provided having elevated and recessed regions therein. The recessed regions are oxidized to form a dielectric liner overlying the surface of the recessed regions. The recessed regions are then filled with a fill material, and a planarization layer is formed to overlie the fill material. A planar surface is formed by removing portions of the planarization layer and the fill material. The planar surface is formed, such that MOS transistors, and the like, can be fabricated in the elevated regions of the substrate without suffering deleterious effects caused by sharp corner regions observed following planarization processes of the prior art.

BRIEF DESCRIPTION OF THE DRAWINGS

FIGS. 1-a and 1-b illustrate, in cross-section, portions of a substrate following a planarization process carried out in accordance with the prior art;

FIG. 1-c illustrates, in cross-section, an MOS transistor formed over a substrate planarized in accordance with the prior art;

Figure 2:
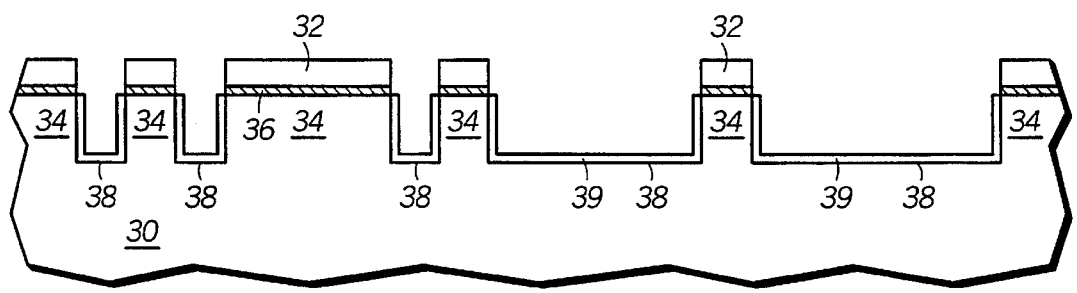
FIGS. 2–7 illustrate, in cross-section, process steps in accordance with the invention.

It will be appreciated that for simplicity and clarity of illustration, elements shown in the FIGURES have not necessarily been drawn to scale. For example, the dimensions of some of the elements are exaggerated relative to each other for clarity. Further, where considered appropriate, reference numerals have been repeated among the FIGURES to indicate corresponding elements.

DETAILED DESCRIPTION OF THE PREFERRED EMBODIMENTS

The present invention provides an improved planarization process by providing, in one aspect, an additional layer of planarizing material prior to polishing a semiconductor substrate. The additional layer of planarizing material prevents the premature removal of all planarizing material in regions of the substrate containing large dielectric isolation regions. By providing additional planarizing material, such as an additional polish stop layer, uniform planarization is achieved regardless of the arrangement of isolation regions in the substrate. The additional polish stop layer prevents dishing of isolation regions having a low pattern density during the CMP process.

In another aspect, the present invention prevents the formation of sharp corners in the substrate surface near recessed regions, such as trench structures, and the like. By forming dielectric liner overlying the surface of the recessed regions, a high density dielectric layer is provided at the substrate surface where sharp corners would normally be formed by processes of the prior art. Through the interaction of the additional planarization layer, and the dielectric liner, the planarization process of the present invention avoids the formation of corner regions, such as corner region 18 shown in FIG. 1-b. Accordingly, improved transistor performance is attained by MOS transistors formed in regions of the substrate containing large dielectric isolation regions.

FIGS. 2–7 illustrate, in cross-section, process steps in accordance with invention. It is important to note that the structure illustrated in FIGS. 2–7 is generalized to illustrate the process of the present invention. However, an actual semiconductor device, to which the process of the present invention can be applied, may appear substantially different from the generalized illustration shown in the drawing. For example, the substrate may contain additional materials, such as buried oxide layers, epitaxial layers, and the like. Also, the process of the present invention can be carried out to planarize deposited layers formed over existing device structure, such as transistors, resistors, capacitors, and the like. Therefore, the following description contemplates the application of the inventive process to a wide variety of substrate configurations and device structures.

FIG. 2 illustrates, in cross-section, a portion of a semiconductor substrate 30 having already undergone several process steps in accordance with the invention. A first planarization layer 32 overlies elevated regions 34 of substrate 30. A silicon dioxide layer 36 separates first planarization layer 32 from elevated regions 34 of substrate 30. Elevated regions 34 are spaced apart by recessed regions 38. Recessed regions 38 can be used to form a variety of components for an integrated circuit device, such as isolation regions, trench capacitors, vertical bipolar transistors, vertically oriented MOS transistors, and the like. In one embodiment, recessed regions 38 are etched into substrate 30 for the purpose of forming trench isolation regions. Electrically-isolated, active device components can then be formed in the elevated regions of the substrate.

Preferably substrate 30 is processed by first thermally oxidizing the surface to form silicon dioxide layer 36. Then, first planarization layer 32 is deposited to overlie silicon dioxide layer 36. First planarization layer 32 is preferably a material capable of providing both etching resistance to a silicon etch, and providing a polish stop for a CMP planarization process. Accordingly, first planarization layer 32 can be a dielectric material such as, silicon nitride, boron nitride, boron oxynitride, silicon-rich silicon nitride, and the like. After depositing first planarization layer 32, a photolithographic mask (not shown) is formed on first planarization layer 32, and an etching process is carried out to etch substrate 30, and to form recessed regions 38. In the majority of applications for the process of the present invention, an anisotropic etching process is preferred to form substantially vertical walls in recessed regions 38. In one embodiment, a reactive ion etching process using chlorinated etching gases is carried out to form recessed regions 38.

After forming recessed regions 38, a dielectric liner 39 is formed overlying the surface of the recessed regions. Preferably, dielectric liner 39 is high-density silicon dioxide material formed by the thermal oxidation of substrate 39. The oxidation process preferably grows silicon dioxide layer to a thickness of about 50 to 1000 angstroms. During the thermal oxidation process, silicon in the substrate surface is consumed as successive layers of silicon dioxide layer form on the surface. The consumption of silicon tends to round the sharp edges in the substrate created by the anisotropic etching process.

Figure 3:
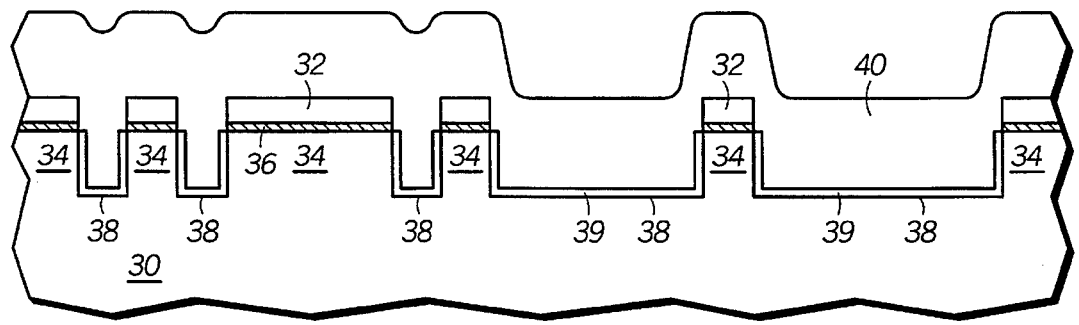

The illustrative process of the invention continues with the deposition of a fill material 40, as illustrated in FIG. 3. The fill material overlies dielectric liner 39 and first planarization layer 32, and fills recessed regions 38. In the fabrication of isolation regions, fill material 40 is a dielectric material, such as silicon dioxide. Preferably, fill material 40 is silicon dioxide deposited by chemical vapor deposition using tetraethylorthosilane (TEOS) source gas. Alternatively, fill material 40 can be silicon dioxide deposited by an atmospheric deposition process, or another dielectric material which is differentially etchable with respect to first planarization layer 32.

Figure 4:
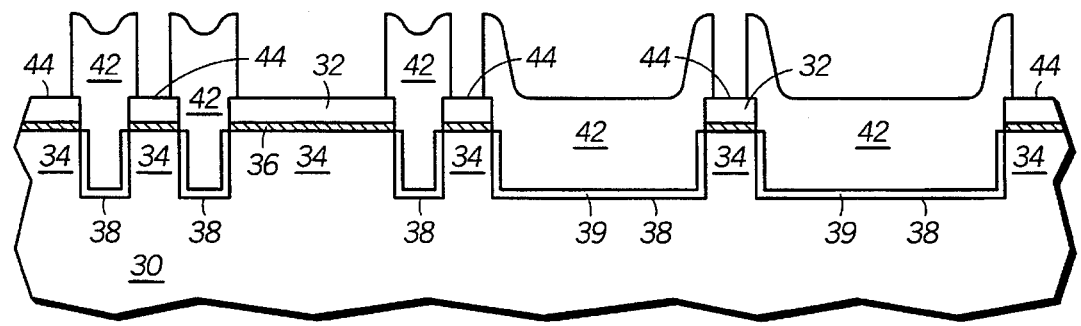

Referring to FIG. 4, after depositing fill material 40, a photolithographic mask (not shown) is formed, and fill material 40 is etched to form dielectric portions 42. Because of the topographic contrast in the substrate created by recessed regions 38, dielectric portions 42 are characterized by protruding regions at the edges of the recessed regions. The etching process also exposes portions 44 of first planarization layer 32. The etching process removes a significant amount of dielectric material from the surface of substrate 30 leaving a large amount of the substrate surface covered only by portions 44 of first planarization layer 32. Preferably, a fluorinated etching process is used to selectively remove the dielectric material of fill layer 40, while not substantially etching first planarization layer 32.

Figure 5:
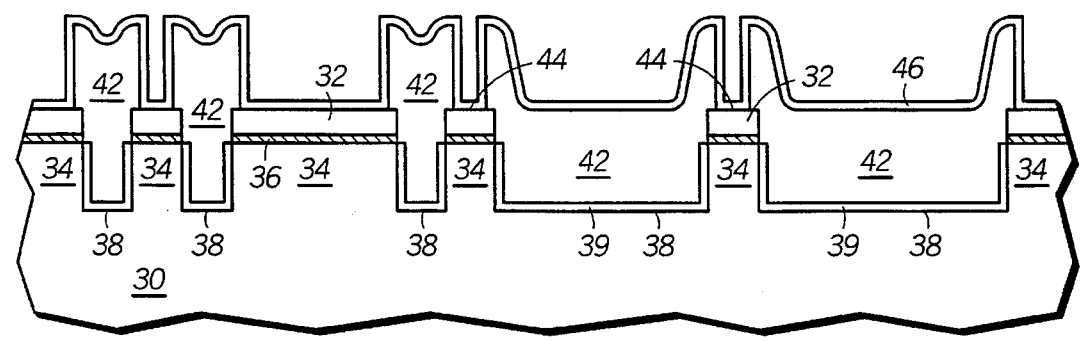

In accordance with the invention, a second planarization layer 46 is deposited to overlie dielectric portions 42 and portions 44 of first planarization layer 32, as illustrated in FIG. 5. Preferably, second planarization layer 46 is a material similar to first planarization layer 32. In a preferred embodiment, second planarization layer 46 is silicon nitride deposited by chemical vapor deposition to a thickness of about 300–500 angstroms. The conformal deposition characteristics of chemically deposited silicon nitride results in the formation of a uniformly thick coating of silicon nitride over the high contrast surface topography of substrate 30. As illustrated in FIG. 5, second planarization layer 46 uniformly overlies the rough surface of dielectric portions 42.

Figure 6:
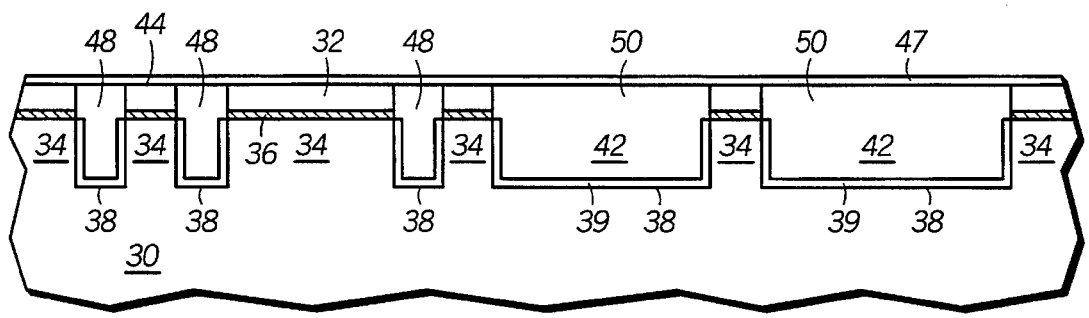

As illustrated in FIG. 6, following the deposition of second planarization layer 46, the protruding regions of dielectric portions 42 and second planarization layer 46 are removed to form a planar surface 47. Planar surface 47 is formed by the uniform polishing of planarizing layer 46 and dielectric portions 42. The formation of planar surface 47 is aided by the combined planarizing layers 32 and 46 overlying elevated regions 34 of substrate 30. The presence of additional planarizing material prevents the over-planarization of regions of substrate 30 containing large isolation regions.

The polishing process also forms isolation regions 48 and 50 in substrate 30. Isolation regions 48 are formed in areas of substrate 30 containing a relatively large amount of planarization material. Correspondingly, isolation regions 50 are formed in areas of substrate 30 containing a relatively smaller amount of planarization material. However, the presence of additional planarization material, formed in accordance with the process of the present invention, results in the uniform polishing removal of dielectric portions 42, such that planar surface 47 extends over the entire area of substrate 30.

To form planar surface 47, a CMP process is carried out by placing substrate 30 in a polishing apparatus, wherein the surface of substrate 30 is polished back for a predetermined amount of time. The process parameters of the CMP process are adjusted, such that fill material 40 is removed at a faster rate than either the first or second planarization layers. Once the regions of dielectric portions 42 protruding above the substrate surface are removed, the polish removal rate diminishes as the platen encounters first and second planarization layers 32 and 46 overlying elevated regions 34 of substrate 30. The presence of large amounts of planarization material equalizes the polishing rate across the surface of substrate 30 resulting in the formation of planar surface 47. Planar surface 47 resides at a uniform distance above substrate 30 across the entire surface of the substrate.

Figure 7:
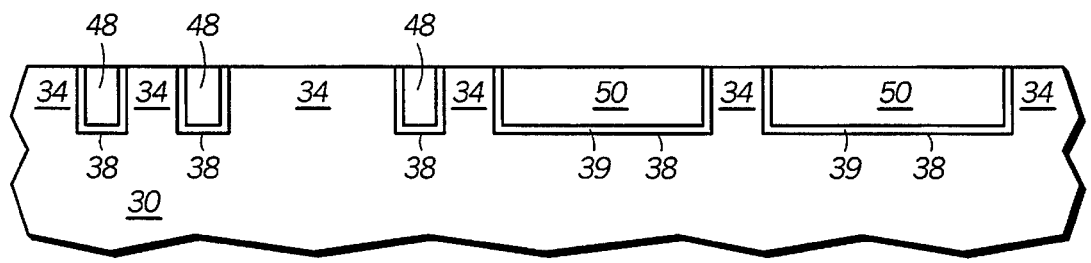

Once a uniform planar surface is formed, the uniformity can be preserved as the various materials overlying the surface are removed by subsequent processing. For example, as illustrated in FIG. 7, after removing remaining portions of first and second planarization layers 32 and 46, and etching away remaining portions of silicon dioxide layer 36, planar surface 47 is propagated into substrate 30. During the removal of silicon dioxide layer 36, portions of isolation regions 48 and 50 protruding above the surface of substrate 30 are also removed. Because of the initial formation of planar surface 47 by the CMP process, the subsequent removal of planarization material and dielectric material maintains the planar characteristics of the surface. Accordingly, once remaining portions of the planarization layers and the fill material are removed, a planar surface is retained on the substrate.

Figure 8:
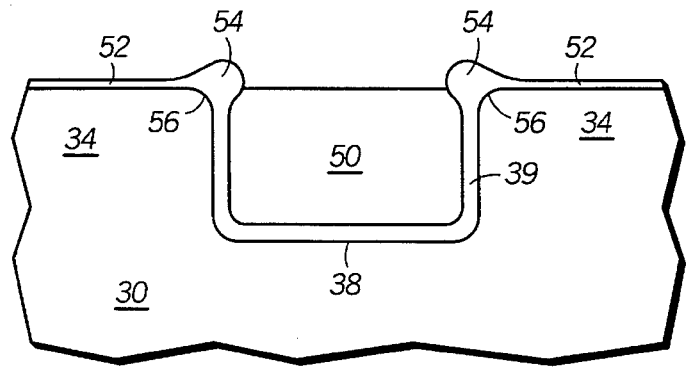
FIG. 8 illustrates, in cross-section, a magnified portion of the substrate illustrated in FIG. 7 showing rounded corner regions obtained by the process of the present invention.

FIG. 8 illustrates a magnified portion of substrate 30 containing isolation region 50. The surface of substrate 30 has been oxidized to form a gate oxide layer 52 overlying elevated regions 34. Dielectric liner 39 merges with gate oxide layer 52 at the substrate surface to form a thick oxide region 54 at the upper surface of isolation region 50. During the oxide etching process following planarization, the chemical vapor deposited dielectric material etches more rapidly than the thermally grown silicon dioxide. The differential etch rate results in the retention of portions of oxide liner 39 at the surface of substrate 30, while slightly depressing the central portion of isolation region 50 below the surface of substrate 30. Also, as previously described, corner regions 56 are slightly rounded during the oxidation process used to form dielectric liner 39. The rounding results from silicon consumption at the corners during the thermal oxidation process. The rounded corners, and the slightly thicker oxide layer at the corner regions will prevent performance degradation in MOS transistors formed in elevated regions 34.

Thus it is apparent that there has been provided, in accordance with the invention, an improved planarization process, which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, rather than removing remaining portions of the planarization layers, they can be retained to act as dielectric materials in the fabrications of other device components. It is therefore intended to include within the invention all such variations and modifications as fall within the scope of the appended claims and equivalents thereof.

We claim:

1. A process for fabricating a semiconductor device comprising the steps of:

providing a semiconductor substrate having elevated and recessed regions therein, wherein a first planarization layer overlies the elevated regions and a dielectric layer overlies the recessed regions;

depositing a fill material to overlie the first planarization layer and the dielectric layer;

etching the fill material to expose portions of the first planarization layer overlying the elevated regions;

forming a second planarization layer to overlie the fill material and the selected portions of the first planarization layer; and planarizing the substrate to form a smooth surface.

2. The process of claim 1, wherein the step of providing a semiconductor substrate comprises oxidizing the recessed regions to form the dielectric layer.

3. The process of claim 1, wherein the step of depositing a fill material comprises chemical vapor deposition of silicon dioxide.

4. The process of claim 1, wherein the step of forming a second planarization layer comprises depositing a layer selected from the group consisting of silicon nitride, boron nitride, silicon-rich silicon nitride, and boron oxynitride.

5. A process for fabricating a semiconductor device comprising the steps of:

providing a substrate having elevated and recessed regions therein;

oxidizing the recessed regions to form a dielectric liner overlying the recessed regions;

forming a fill material overlying the elevated regions and filling the recessed regions;

removing a portion of the fill material overlying the elevated regions;

forming an etch stop layer overlying the elevated regions and the fill material; and removing portions of the etch stop layer and the fill material to form a planar surface.

6. The process of claim 5 further comprising the steps of:

etching away remaining portions of the etch stop layer; and forming a gate dielectric layer on the elevated regions of the substrate, such that the dielectric liner remains intermediate to the gate dielectric layer and the fill material.

7. The process of claim 5, wherein the step of forming an etch stop layer comprises depositing a layer selected from the group consisting of silicon nitride, boron nitride, silicon-rich silicon nitride, and boron oxynitride.

8. The process of claim 5, wherein the step of forming a fill material comprises chemical vapor deposition of silicon dioxide.

9. The process of claim 5, wherein the step of removing portions of the etch stop layer and the fill material comprises chemical-mechanical-polishing.

10. A process for fabricating a semiconductor device comprising the steps of:

providing a substrate having a first planarization layer overlying the substrate, the first planarization layer having an opening therein exposing a portion of the substrate;

etching the substrate to form a trench in the exposed portion of the substrate;

oxidizing the substrate to form a dielectric liner overlying the trench;

depositing a fill material to overlie the first planarization layer and to fill the trench;

etching the fill material to expose portions of the first planarization layer;

depositing a second planarization layer to overlie the fill material and the exposed portions of the first planarization layer; and polishing back the second planarization layer and the fill material to form a planar surface.

\* \* \* \* \*